United States Patent
Mase et al.

(10) Patent No.: US 10,224,354 B2
(45) Date of Patent: Mar. 5, 2019

(54) DISTANCE IMAGE SENSOR

(71) Applicant: HAMAMATSU PHOTONICS K.K., Hamamatsu-shi, Shizuoka (JP)

(72) Inventors: Mitsuhito Mase, Hamamatsu (JP); Jun Hiramitsu, Hamamatsu (JP); Akihiro Shimada, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 294 days.

(21) Appl. No.: 15/308,668

(22) PCT Filed: Jan. 29, 2015

(86) PCT No.: PCT/JP2015/052465
§ 371 (c)(1),
(2) Date: Nov. 3, 2016

(87) PCT Pub. No.: WO2015/170487
PCT Pub. Date: Nov. 12, 2015

(65) Prior Publication Data
US 2017/0194370 A1      Jul. 6, 2017

(30) Foreign Application Priority Data
May 8, 2014    (JP) ................................ 2014-096703

(51) Int. Cl.
*H01L 27/146*    (2006.01)
*G01S 17/89*      (2006.01)
(Continued)

(52) U.S. Cl.
CPC .......... *H01L 27/14603* (2013.01); *G01C 3/08* (2013.01); *G01S 7/486* (2013.01);
(Continued)

(58) Field of Classification Search
None
See application file for complete search history.

(56) References Cited

U.S. PATENT DOCUMENTS

| 2009/0114919 A1* | 5/2009 | Kawahito ............... G01C 3/02 257/59 |
| 2013/0120735 A1 | 5/2013 | Mase et al. |
| 2013/0128259 A1 | 5/2013 | Mase et al. |

FOREIGN PATENT DOCUMENTS

| CN | 1747177 | 3/2006 |
| CN | 103155150 | 6/2013 |

(Continued)

OTHER PUBLICATIONS

International Preliminary Report on Patentability dated Nov. 17, 2016 for PCT/JP2015/052465.

*Primary Examiner* — Hovhannes Baghdasaryan
(74) *Attorney, Agent, or Firm* — Drinker Biddle & Reath LLP

(57) ABSTRACT

In any three of three range sensors consecutively aligned in a one-dimensional direction, first signal charge-accumulating regions are adjacent to each other in the one-dimensional direction in the range sensor positioned in a center of the three range sensors and the range sensor positioned closer to one side of the one-dimensional direction than the range sensor positioned in the center of the three range sensors, and the first signal charge-accumulating region and the second signal charge-accumulating region are adjacent to each other in the one-dimensional direction in the range sensor positioned in the center of the three range sensors and the range sensor positioned closer to an another side of the one-dimensional direction than the range sensor positioned in the center of the three range sensors.

2 Claims, 8 Drawing Sheets

(51) Int. Cl.
  *G01S 7/486* (2006.01)
  *G01C 3/08* (2006.01)
  *G01S 7/491* (2006.01)
  *G01S 17/36* (2006.01)

(52) U.S. Cl.
  CPC .......... *G01S 7/4914* (2013.01); *G01S 7/4915* (2013.01); *G01S 17/36* (2013.01); *G01S 17/89* (2013.01); *H01L 27/14612* (2013.01); *H01L 27/14643* (2013.01)

(56) References Cited

FOREIGN PATENT DOCUMENTS

| | | |
|---|---|---|
| JP | 2009-047661 A | 3/2009 |
| JP | 2011-133464 A | 7/2011 |
| JP | 2012-083213 A | 4/2012 |
| JP | 2012-083214 A | 4/2012 |
| JP | 2013-178121 A | 9/2013 |
| JP | 2013-206903 A | 10/2013 |
| WO | WO-2007/026779 A1 | 3/2007 |

* cited by examiner

DISTANCE IMAGE SENSOR

TECHNICAL FIELD

The present invention relates to a range image sensor.

BACKGROUND ART

There is known a charge-distributing type range image sensor (for example, see Patent Literature 1). The range image sensor disclosed in Patent Literature 1 is a charge-distributing type range image sensor, and includes a plurality of range sensors. Each of the range sensors includes a charge-generating region generating charges in accordance with incident light, two signal charge-accumulating regions disposed to sandwich the charge-generating region in a one-dimensional direction and away from the charge-generating region, and two transfer electrodes disposed between the signal charge-accumulating region and the charge-generating region. A charge-distributing type range image sensor can be applied to Time-Of-Flight (TOF) type ranging.

CITATION LIST

Patent Literature

Patent Literature 1: WO 2007/026779 A1

SUMMARY OF INVENTION

Technical Problem

In a charge-distributing type range image sensor including a plurality of range sensors disposed in a one-dimensional direction, when charge crosstalk (leakage) occurs between adjacent range sensors in the one-dimensional direction, the influence of the charge crosstalk on ranging may be different between the adjacent range sensors. If the influence of the charge crosstalk on the ranging is different between the adjacent range sensors, it is difficult to appropriately perform the ranging.

An object of the present invention is to provide a charge-distributing type range image sensor as a range image sensor in which influence of charge crosstalk on ranging is similar between range sensors adjacent to each other in a one-dimensional direction when the charge crosstalk occurs between the adjacent range sensors.

Solution to Problem

One aspect of the present invention is a range image sensor including a plurality of range sensors disposed in a one-dimensional direction, in which each of the plurality of range sensors includes a charge-generating region that generates charge in accordance with incident light, a first and a second signal charge-accumulating regions that are disposed away from the charge-generating region to sandwich the charge-generating region in the one-dimensional direction, and accumulate charges generated in the charge-generating region as signal charges, a first transfer electrode that is disposed between the first signal charge-accumulating region and the charge-generating region and allows the charges generated in the charge-generating region to flow into the first signal charge-accumulating region as the signal charges in accordance with a first transfer signal, and a second transfer electrode that is disposed between the second signal charge-accumulating region and the charge-generating region and allows the charges generated in the charge-generating region to flow into the second signal charge-accumulating region as the signal charges in accordance with a second transfer signal different in phase from the first transfer signal. In any three of the range sensors consecutively aligned in the one-dimensional direction, the first signal charge-accumulating regions or the second signal charge-accumulating regions are adjacent to each other in the one-dimensional direction in a range sensor positioned in a center of the three range sensors and a range sensor positioned closer to one side of the one-dimensional direction than the range sensor positioned in the center of the three range sensors, and the first signal charge-accumulating region and the second signal charge-accumulating region are adjacent to each other in the one-dimensional direction in the range sensor positioned in the center of the three range sensors and a range sensor positioned closer to an another side of the one-dimensional direction than the range sensor positioned in the center of the three range sensors.

Another aspect of the present invention is a range image sensor including a plurality of range sensors disposed in a one-dimensional direction, in which each of the plurality of range sensors includes a charge-generating region that generates charge in accordance with incident light, a first and a second signal charge-accumulating regions that are disposed away from the charge-generating region to sandwich the charge-generating region in the one-dimensional direction, and accumulate the charges generated in the charge-generating region as signal charges, a first transfer electrode that is disposed between the first signal charge-accumulating region and the charge-generating region and allows the charges generated in the charge-generating region to flow into the first signal charge-accumulating region as the signal charges in accordance with a first transfer signal, and a second transfer electrode that is disposed between the second signal charge-accumulating region and the charge-generating region and allows the charges generated in the charge-generating region to flow into the second signal charge-accumulating region as the signal charges in accordance with a second transfer signal different in phase from the first transfer signal. A range sensor group including the two range sensors in which the first signal charge-accumulating regions are adjacent to each other in the one-dimensional direction, and a range sensor group including the two range sensors in which the second signal charge-accumulating regions are adjacent to each other in the one-dimensional direction are alternately aligned in the one-dimensional direction.

Attention is focused on an arbitrary range sensor among the plurality of range sensors. When the first signal charge-accumulating region is positioned closer to the other side of the one-dimensional direction than the charge-generating region in a range sensor positioned next to the arbitrary range sensor in one direction of the one-dimensional direction, the first signal charge-accumulating region is positioned closer to the one side of the one-dimensional direction than the charge-generating region in a range sensor positioned next to the arbitrary range sensor in an another direction of the one-dimensional direction. When the second signal charge-accumulating region is positioned closer to the other side of the one-dimensional direction than the charge-generating region in the range sensor positioned next to the arbitrary range sensor in the one direction, the second signal charge-accumulating region is positioned closer to the one side of the one-dimensional direction than the charge-generating region in the range sensor positioned next to the arbitrary range sensor in the other direction. That is, in the range sensor positioned next to the arbitrary range sensor in the one direction and the range sensor positioned next to the arbitrary range sensor in the other direction, the signal charge-accumulating regions positioned at the arbitrary range sensor side are the first signal charge-accumulating regions or the second signal charge-accumulating regions, and the same types of signal charge-accumulating regions.

Thus, when a part of the charges generated in the charge-generating region in the arbitrary range sensor leaks into the range sensor positioned next to the arbitrary range sensor in the one direction and the range sensor positioned next to the arbitrary range sensor in the other direction, the leaking charge flows into the first signal charge-accumulating regions or the second signal charge-accumulating regions of the two range sensors. The charge leaking into the two range sensors is accumulated in the first signal charge-accumulating regions or the second signal charge-accumulating regions in the two range sensors. Accordingly, when charge crosstalk occurs between the range sensors adjacent to each other in the one-dimensional direction, the types of the signal charge-accumulating regions, in which the leaking charge is accumulated, in the two range sensors positioned at both sides among any three of range sensors consecutively aligned in the one-dimensional direction are the same, and the influence of the charge crosstalk on ranging between the range sensors adjacent to each other in the one-dimensional direction is similar.

Advantageous Effects of Invention

According to the present invention, it is possible to provide a charge-distributing type range image sensor as a range image sensor in which influence of charge crosstalk on ranging is similar between range sensors adjacent to each other in a one-dimensional direction when the charge crosstalk occurs between the adjacent range sensors.

DESCRIPTION OF EMBODIMENT

Hereinafter, an embodiment of the present invention will be described in detail with reference to the drawings. In the description, the same elements or elements with the same functionality will be denoted by the same reference signs, without redundant description.

Figure 1:
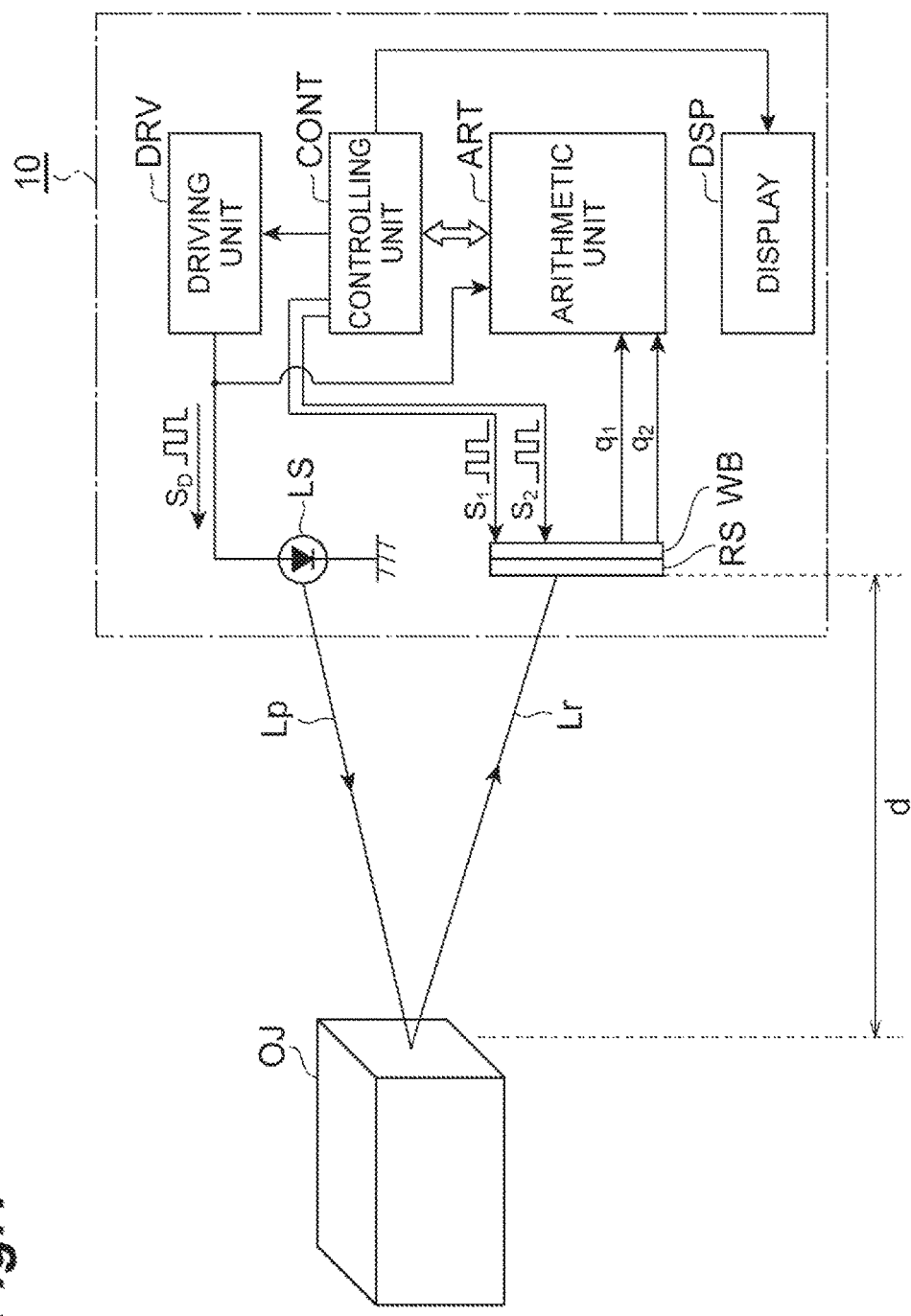
FIG. 1 is an explanatory diagram illustrating a configuration of a ranging device according to an embodiment of the present invention.

FIG. 1 is an explanatory diagram illustrating a configuration of a ranging device according to the present embodiment.

A ranging device 10 is a device measuring a distance d to an object OJ. The ranging device 10 includes a range image sensor RS, a light source LS, a display DSP, and a control unit. The control unit includes a driving unit DRV, a controlling unit CONT, and an arithmetic unit ART. The light source LS emits pulse light Lp toward the object OJ. The light source LS includes by, for example, a laser light irradiation device or an LED. The range image sensor RS is a charge-distributing type range image sensor and is also a TOF type range image sensor. The range image sensor RS is disposed on a wiring substrate WB.

The control unit (the driving unit DRV, the controlling unit CONT, and the arithmetic unit ART) includes a hardware including an arithmetic circuit, such as a central processing unit (CPU), a memory, such as a random access memory (RAM) and a read only memory (ROM), a power circuit, and a read circuit including an A/D converter. The whole or a part of the control unit may be constituted by an integrated circuit, such as an application specific integrated circuit (ASIC) or a field programmable gate array (FPGA).

The driving unit DRV applies a drive signal $S_D$ to the light source LS in accordance with a control of the controlling unit CONT, and drives the light source LS to emit the pulse light Lp toward the object OJ per frame period. The controlling unit CONT controls the driving unit DRY. The controlling unit CONT outputs a first and a second transfer signals $S_{p1}$ and $S_{p2}$ to the range image sensor RS. The controlling unit CONT displays an arithmetic result of the arithmetic unit ART on the display DSP. The arithmetic unit ART reads, from the range image sensor RS, charge quantities $q_1$ and $q_2$ of signal charges, and calculates the distance d based on the readout charge quantities $q_1$ and $q_2$. The arithmetic unit ART outputs the arithmetic result to the controlling unit CONT. The method for calculating the distance d will be described later with reference to FIG. 8. The display DSP displays the arithmetic result of the arithmetic unit ART input from the controlling unit CONT In the ranging device 10, by applying the drive signal $S_D$ to the light source LS, the pulse light Lp is emitted from the light source LS per frame period. When the pulse light Lp emitted from the light source LS is incident onto the object OJ, reflection light Lr, which is the pulse light, is emitted from the object OJ by reflection. The reflection light Lr emitted from the object OJ is incident onto the range image sensor RS.

The charge quantities $q_1$ and $q_2$ collected in synchronism with the first and second transfer signals $S_{p1}$ and $S_{p2}$ are output for each pixel from the range image sensor RS. The charge quantities $q_1$ and $q_2$ output from the range image sensor RS are input to the arithmetic unit ART in synchronism with the drive signal $S_D$. In the arithmetic unit ART, the distance d is calculated for each pixel based on the input charge quantities $q_1$ and $q_2$. The arithmetic result is input to the controlling unit CONT from the arithmetic unit ART. The arithmetic result input to the controlling unit CONT is transferred to the display DSP and displayed.

Figure 2:
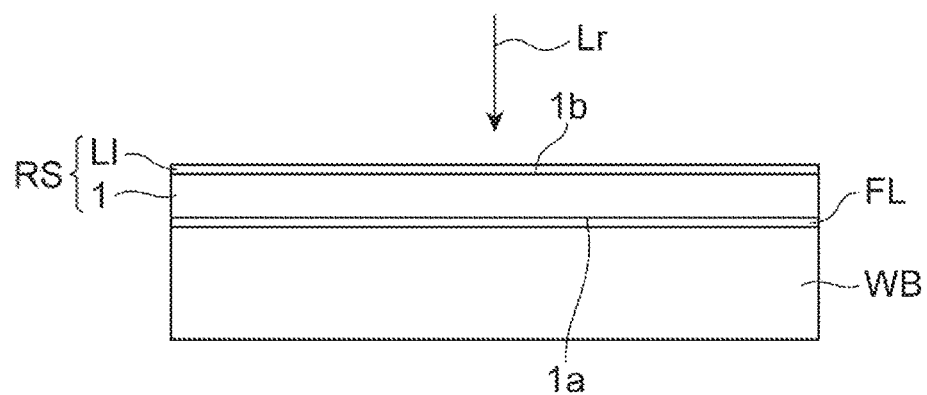
FIG. 2 is a diagram for explaining a cross-sectional configuration of a range image sensor.

FIG. 2 is a diagram explaining a cross-sectional configuration of a range image sensor.

The range image sensor RS is a front-illuminated range image sensor, and includes a semiconductor substrate 1. The semiconductor substrate 1 has a first and a second surfaces 1a and 1b opposing each other. The second surface 1b is a light incident surface. The range image sensor RS is attached on the wiring substrate WB through an adhesive region FL in a state where a first surface 1a side of the semiconductor substrate 1 is opposing the wiring substrate WB. The adhesive region FL includes an insulation adhesive or a filler. The reflection light Lr is incident onto the range image sensor RS from a second surface 1b side of the semiconductor substrate 1.

Figure 3:
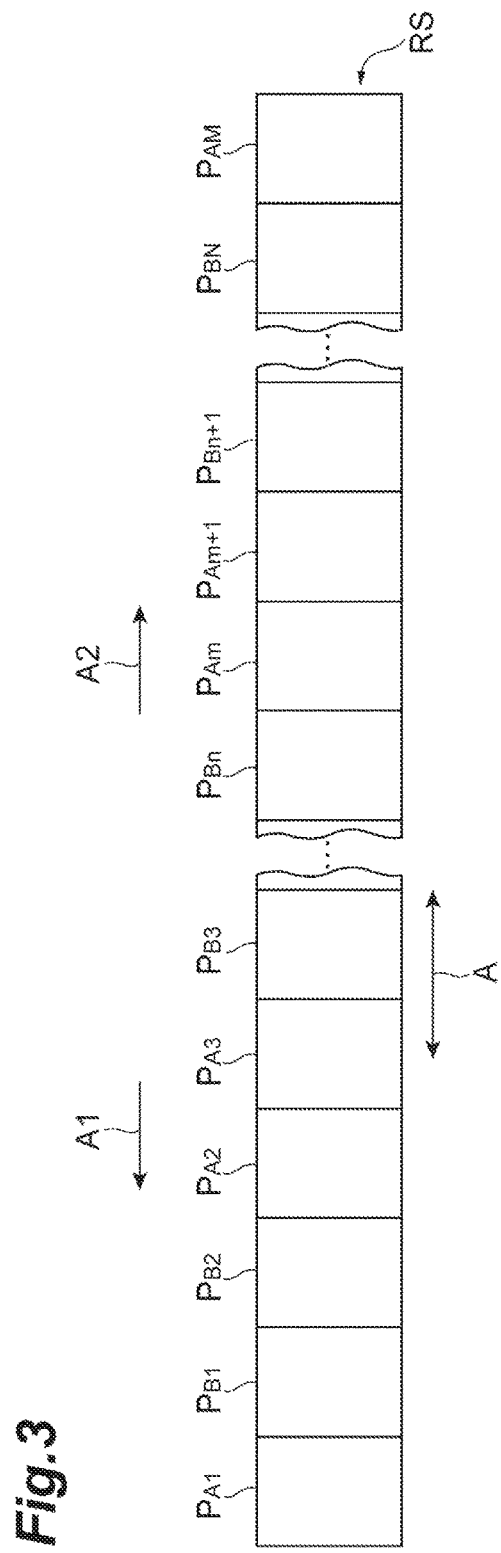
FIG. 3 is a diagram illustrating a configuration of the range image sensor.
Figure 4:
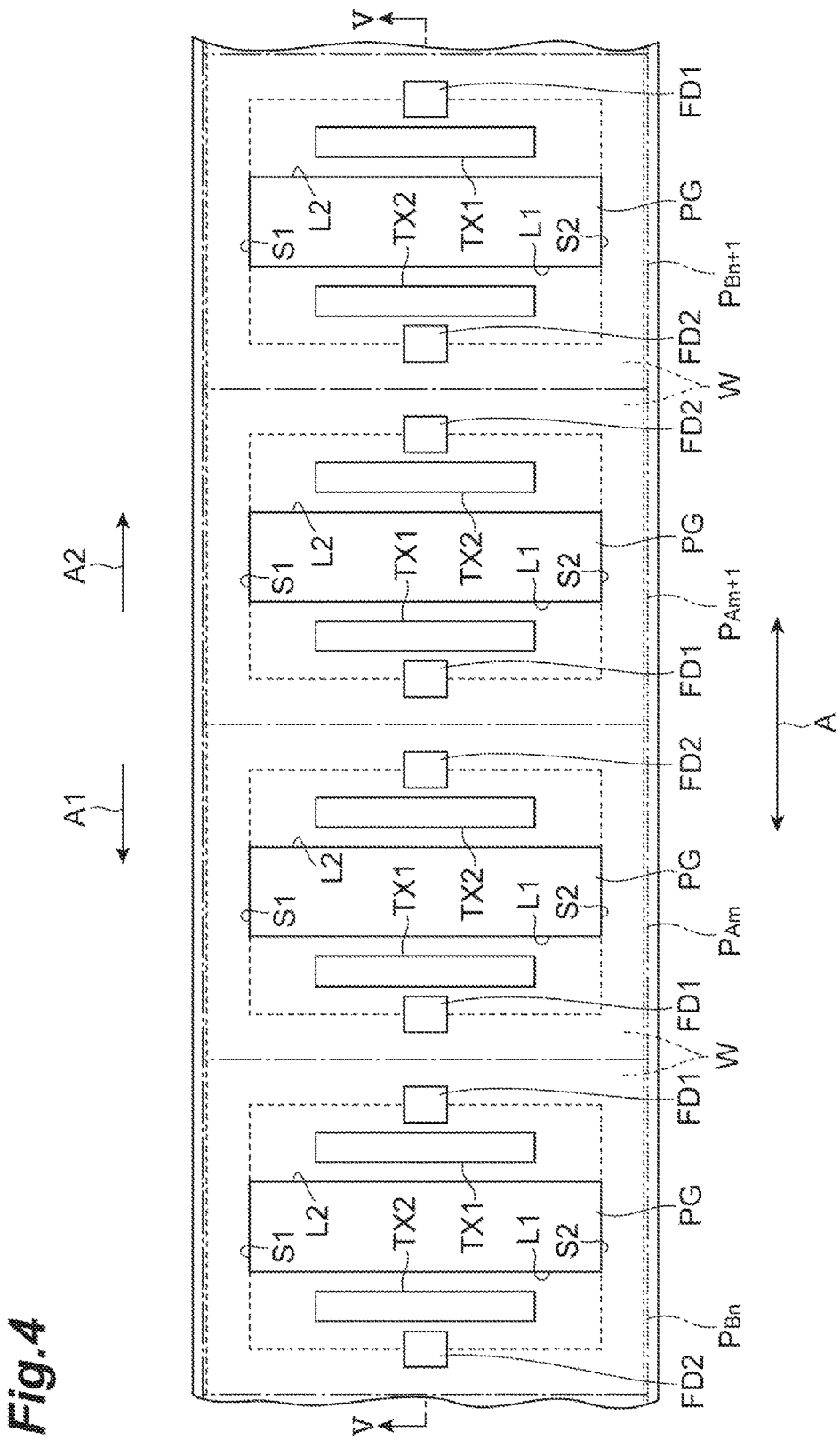
FIG. 4 is a substantially plan view illustrating the range image sensor.
Figure 5:
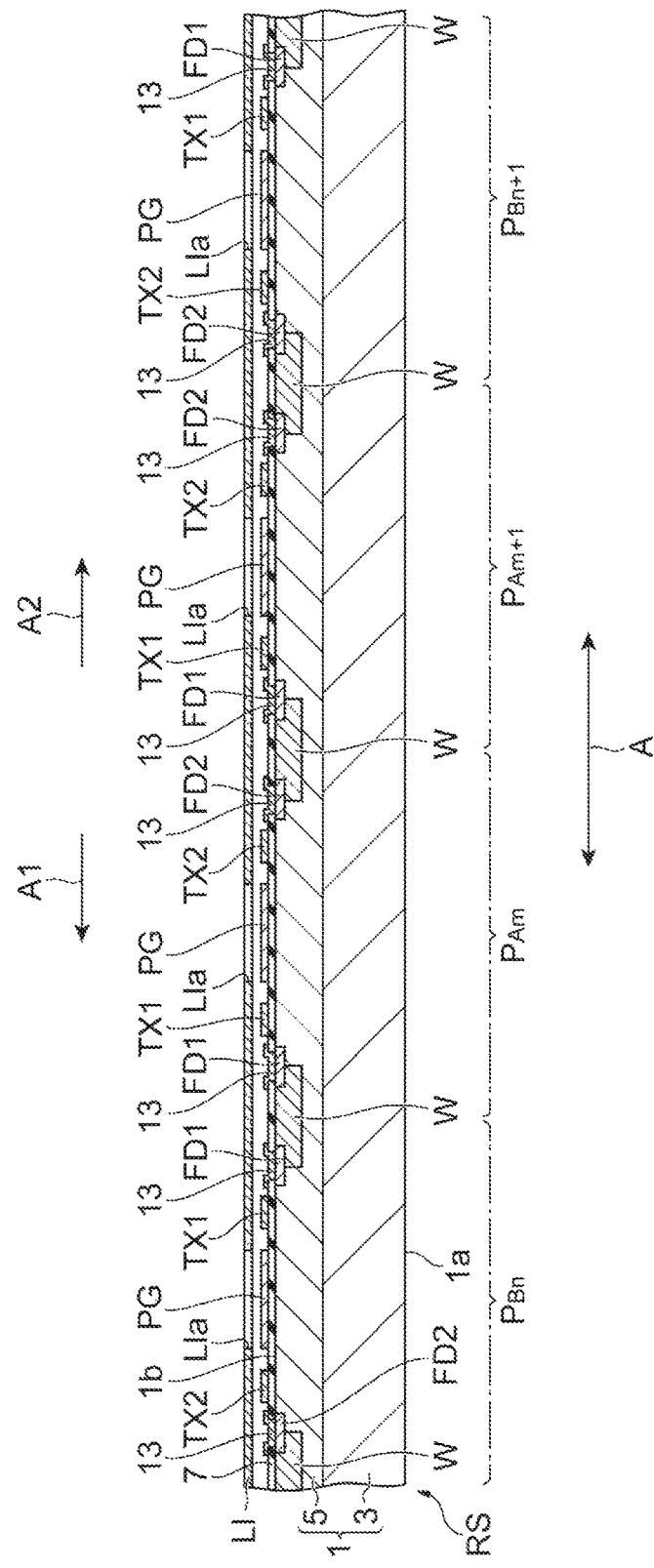
FIG. 5 is a diagram illustrating a cross-sectional configuration taken along the line V-V of FIG. 4.

Next, the range image sensor RS will be described in detail with reference to FIGS. 3 and 4. FIG. 3 is a diagram illustrating a configuration of the range image sensor. FIG. 4 is a substantially plan view illustrating the range image sensor. FIG. 5 is a diagram illustrating a cross-sectional configuration taken along the line V-V of FIG. 4.

As illustrated in FIG. 3, the range image sensor RS is a line sensor with an array structure that includes a plurality of range sensors $P_{A1}$ to $P_{AM}$, and $P_{B1}$ to $P_{BN}$ (M and N are natural numbers equal to or greater than 2) disposed in a one-dimensional direction A. One, or two or more of the range sensors $P_{A1}$ to $P_{AM}$ and $P_{B1}$ to $P_{BN}$ constitute one pixel (channel) of the range image sensor RS. In the present embodiment, each of the range sensors $P_{A1}$ to $P_{AM}$ and $P_{B1}$ to $P_{BN}$ constitutes one pixel of the range image sensor RS.

The range image sensor RS includes a light interception layer LI on the second surface 1b which is the light incident surface. On the light interception layer LI, an aperture LIa is formed in a region corresponding to each of the range sensors $P_{A1}$ to $P_{AM}$ and $P_{B1}$ to $P_{BN}$ in the one-dimensional direction A. The aperture LIa has a rectangular shape. In the present embodiment, the aperture LIa has an oblong rectangular shape. Light passes through the aperture LIa of the light interception layer LI, and is incident onto the semiconductor substrate 1. Thus, the aperture LIa defines a light receiving region in the semiconductor substrate 1. The light interception layer LI is made of, for example, metal, such as aluminum. The light interception layer LI is not illustrated in FIGS. 3 and 4.

The semiconductor substrate 1 includes a p-type first semiconductor region 3 positioned at the first surface 1a side, and a p⁻-type second semiconductor region 5 having a lower impurity concentration than the first semiconductor region 3 and positioned at the second surface 1b side. The semiconductor substrate 1 can be obtained by, for example, growing, on a p-type semiconductor substrate, a p⁻-type epitaxial layer having a lower impurity concentration than the semiconductor substrate. An insulation layer 7 is formed on the second surface 1b (the second semiconductor region 5) of the semiconductor substrate 1. The range sensors $P_{A1}$ to $P_{AM}$ and $P_{B1}$ to $P_{BN}$ are disposed on the semiconductor substrate 1 in the one-dimensional direction A. That is, the range sensors $P_{A1}$ to $P_{AM}$ and $P_{B1}$ to $P_{BN}$ are positioned in the semiconductor substrate 1 to be aligned along the one-dimensional direction A.

As illustrated in FIGS. 4 and 5, each of the range sensors $P_{A1}$ to $P_{AM}$ and $P_{B1}$ to $P_{BN}$ includes a photo-gate electrode PG a first and a second signal charge-accumulating regions FD1 and FD2, a first and a second transfer electrodes TX1 and TX2, and a p-type well region W. In FIG. 4, conductors 13 disposed on the first and second signal charge-accumulating regions FD1 and FD2 (see FIG. 5) are omitted. In FIG. 4, only the configurations of the four range sensors $P_{Am}$, $P_{Am+1}$, $P_{Bn}$, and $P_{Bn+1}$ (m is a natural number equal to or less than M, and n is a natural number equal to or less than N) are illustrated. Each of the range sensors $P_{A1}$ to $P_{AM}$ has a similar configuration to that of the range sensors $P_{Am}$ and $P_{Am+1}$. Each of the range sensors $P_{B1}$ to $P_{BN}$ has a similar configuration to that of the range sensors $P_{Bn}$ and $P_{Bn+1}$.

The photo-gate electrode PG is disposed corresponding to the aperture LIa. A region corresponding to the photo-gate electrode PG (a region located below the photo-gate electrode PG in FIG. 5) in the semiconductor substrate 1 (the second semiconductor region 5) functions as a charge-generating region (a photosensitive region) that generates charges in accordance with incidence of the reflection light Lr of the pulse light Lp reflected off the object OJ. The photo-gate electrode PG also corresponds to the shape of the aperture LIa, and has a rectangular shape in a plan view. In the present embodiment, the photo-gate electrode PG has an oblong rectangular shape just like the aperture LIa. That is, the photo-gate electrode PG has a planar shape having a first and a second long side-edges L1 and L2, which are orthogonal to the one-dimensional direction A and opposing each other, and a first and a second short side-edges S1 and S2, which are parallel to the one-dimensional direction A and opposing each other. The photo-gate electrode PG has the first long side-edge L1 in a side of one direction A1 of the one-dimensional direction A, and the second long side-edge L2 in a side of an another direction A2 of the one-dimensional direction A.

The first and second signal charge-accumulating regions FD1 and FD2 are disposed to sandwich the photo-gate electrode PG in the one-dimensional direction A. In each of the range sensors $P_{Am}$ and $P_{Am+1}$, the first signal charge-accumulating region FD1 is disposed at a first long side-edge L1 side of the photo-gate electrode PG away from the photo-gate electrode PG. The second signal charge-accumulating region FD2 is disposed at a second long side-edge L2 side of the photo-gate electrode PG away from the photo-gate electrode PG. In each of the range sensors $P_{Bn}$ and $P_{Bn+1}$, the first signal charge-accumulating region FD1 is disposed at the second long side-edge L2 side of the photo-gate electrode PG separately from the photo-gate electrode PG. The second signal charge-accumulating region FD2 is disposed at the first long side-edge L1 side of the photo-gate electrode PG separately from the photo-gate electrode PG. That is, in any one of the range sensors $P_{Am}$, $P_{Am+1}$, $P_{Bn}$, and $P_{Bn+1}$, the first and second signal charge-accumulating regions FD1 and FD2 are disposed away from the charge-generating region (the region located below the photo-gate electrode PG).

The first and second signal charge-accumulating regions FD1 and FD2 are n-type semiconductor regions, which are formed on the second semiconductor region 5 and have high impurity concentration, and accumulate charges generated in the charge-generating region as signal charges. The first and second signal charge-accumulating regions FD1 and FD2 each have a rectangular shape in a plan view. In the present embodiment, the first and second signal charge-accumulating regions FD1 and FD2 each have a square shape in a plan view, and have the same shape. The first and second signal charge-accumulating regions FD1 and FD2 are floating diffusion regions.

The first transfer electrode TX1 is disposed on the insulation layer 7 and between the first signal charge-accumulating region FD1 and the photo-gate electrode PG. The first transfer electrode TX1 is disposed away from the first signal charge-accumulating region FD1 and the photo-gate electrode PG. The first transfer electrode TX1 allows the charges generated in the charge-generating region in accordance with the first transfer signal $S_{p1}$ (see FIG. 8) to flow into the first signal charge-accumulating region FD1 as the signal charges.

The second transfer electrode TX2 is disposed on the insulation layer 7 and between the second signal charge-accumulating region FD2 and the photo-gate electrode PG. The second transfer electrode TX2 is disposed away from the second signal charge-accumulating region FD2 and the photo-gate electrode PG. The second transfer electrode TX2 allows the charges generated in the charge-generating region in accordance with the second transfer signal $S_{p2}$ (see FIG. 8), which is different in phase from the first transfer signal $S_{p1}$, to flow into the second signal charge-accumulating region FD2 as the signal charges.

The first and second transfer electrodes TX1 and TX2 each have a rectangular shape in a plan view. In the present embodiment, the first and second transfer electrodes TX1 and TX2 each have an oblong rectangular shape having long side-edges in the direction orthogonal to the one-dimensional direction A, and have the same shape. The length of the long side-edges of the first and second transfer electrodes TX1 and TX2 is shorter than the length of the first and second long side-edges L1 and L2 of the photo-gate electrode PG.

In the adjacent two range sensors $P_{Am}$ and $P_{Bn}$, the first signal charge-accumulating regions FD1 are adjacent to each other in the one-dimensional direction A. In the adjacent two range sensors $P_{Am+1}$ and $P_{Bn+1}$, the second signal charge-accumulating regions FD2 are adjacent to each other in the one-dimensional direction A. In the adjacent two range sensors $P_{Am}$ and $P_{Am+1}$, the first signal charge-accumulating region FD1 and the second signal charge-accumulating region FD2 are adjacent to each other in the one-dimensional direction A. In the adjacent two range sensors $P_{Bn-1}$ and $P_{Bn}$, the first signal charge-accumulating region FD1 and the second signal charge-accumulating region FD2 are adjacent to each other in the one-dimensional direction A.

In any three of range sensors consecutively aligned in the one-dimensional direction A (for example, the three range sensors $P_{Bn}$, $P_{Am}$, and $P_{Am+1}$) in the range image sensor RS, the first signal charge-accumulating regions FD1 are adjacent to each other in the one-dimensional direction A in a range sensor (for example, the range sensor $P_{Am}$) positioned in a center of the three range sensors and a range sensor (for example, the range sensor $P_{Bn}$) positioned next to the range sensor in one direction A1. In the range sensor positioned in the center of the above three range sensors (for example, the range sensor $P_{Am}$) and a range sensor positioned next to the range sensor in the other direction A2 (for example, the range sensor $P_{Am+1}$), the first signal charge-accumulating region FD1 and the second signal charge-accumulating region FD2 are adjacent to each other in the one-dimensional direction A.

For example, in the three range sensors $P_{Am}$, $P_{Am+1}$, $P_{Bn+1}$ consecutively aligned in the one-dimensional direction A, the second signal charge-accumulating regions FD2 are adjacent to each other in the one-dimensional direction A in the range sensor $P_{Am+1}$ positioned in a center of the three range sensors $P_{Am}$, $P_{Am+1}$, $P_{Bn+1}$ and the range sensor $P_{Bn+1}$ positioned next to the range sensor $P_{Am+1}$ in the other direction A2. In the range sensor $P_{Am+1}$ and the range sensor $P_{Am}$ positioned next to the range sensor $P_{Am+1}$ in the one direction A1, the first signal charge-accumulating region FD1 and the second signal charge-accumulating region FD2 are adjacent to each other in the one-dimensional direction A.

The range image sensor RS includes a plurality of first range sensor groups including the two range sensors $P_{Am}$ and $P_{Bn}$ in which the first signal charge-accumulating regions FD1 are adjacent to each other in the one-dimensional direction A, and a plurality of second range sensor groups including the two range sensors $P_{Am+1}$ and $P_{Bn+1}$ in which the second signal charge-accumulating regions FD2 are adjacent to each other in the one-dimensional direction A. The plurality of first range sensor groups and the plurality of second range sensor groups are alternately aligned in the one-dimensional direction A.

In the adjacent two range sensors $P_{Am}$ and $P_{Bn}$, the first transfer electrodes TX1 are adjacent to each other in the one-dimensional direction A. In the adjacent two range sensors $P_{Am+1}$ and $P_{Bn+1}$, the second transfer electrodes TX2 are adjacent to each other in the one-dimensional direction A. In the adjacent two range sensors $P_{Am}$ and $P_{Am+1}$, the first transfer electrode TX1 and the second transfer electrode TX2 are adjacent to each other in the one-dimensional direction A. In the adjacent two range sensors $P_{Bn-1}$ and $P_{Bn}$, the first transfer electrode TX1 and the second transfer electrode TX2 are adjacent to each other in the one-dimensional direction A.

The well region W is formed in the second semiconductor region 5 to surround the photo-gate electrode PG, the first and second transfer electrodes TX1 and TX2, and the first and second signal charge-accumulating regions FD1 and FD2 when viewed from the direction orthogonal to the second surface 1b. The well region W is overlapped by a portion of each of the first and second signal charge-accumulating regions FD1 and FD2 when viewed from the direction orthogonal to the second surface 1b. A periphery of the well region W substantially conforms to a periphery of each of the range sensors $P_{A1}$ to $P_{AM}$ and $P_{B1}$ to $P_{BN}$. The well region W is the same conductive type as the conductive type of the second semiconductor region 5, and has higher impurity concentration than the impurity concentration of the second semiconductor region 5. The well region W suppresses the coupling between a depletion layer expanded by applying voltage to the photo-gate electrode PG and a depletion layer expanded from the first and second signal charge-accumulating regions FD1 and FD2. Accordingly, a crosstalk is suppressed.

The insulation layer 7 is provided with contact holes for exposing the surface of the second semiconductor region 5. The conductors 13 are disposed in the contact holes to connect the first and second signal charge-accumulating regions FD1 and FD2 to the outside thereof.

In the present embodiment, the "high impurity concentration" means that impurity concentration is, for example, about $1 \times 10^{17}$ cm$^{-3}$ or more, and is indicated by adding "+" to a conductive type. The "low impurity concentration" means that impurity concentration is, for example, about $10 \times 10^{15}$ cm$^{-3}$ or less, and is indicated by adding "−" to a conductive type.

The thickness/impurity concentration of each semiconductor region is as follows:

The first semiconductor region 3: thickness 10 to 1000 μm/impurity concentration $1 \times 10^{12}$ to $10^{19}$ cm$^{-3}$, The second semiconductor region 5: thickness 1 to 50 μm/impurity concentration $1 \times 10^{12}$ to $10^{15}$ cm$^{-3}$, The first and second signal charge-accumulating regions FD1 and FD2: thickness 0.1 to 1 μm/impurity concentration $1 \times 10^{18}$ to $10^{20}$ cm$^{-3}$, and The well region W: thickness 0.5 to 5 μm/impurity concentration $1 \times 10^{16}$ to $10^{18}$ cm$^{-3}$.

A reference potential (for example, a ground potential) is supplied to the semiconductor substrate 1 (the first and second semiconductor regions 3 and 5) through a back gate, a through-via electrode, or the like. The semiconductor substrate 1 is made of Si, the insulation layer 7 is made of SiO$_2$, and the photo-gate electrode PG and the first and second transfer electrodes TX1 and TX2 are made of polysilicon, but they may be made of other materials.

The phase of the first transfer signal $S_{p1}$ applied to the first transfer electrode TX1 is shifted by 180° from the phase of the second transfer signal $S_{p2}$ applied to the second transfer electrode TX2. The light incident on the range sensors $P_{A1}$ to $P_{AM}$ and $P_{B1}$ to $P_{BN}$ is converted into charges in the semiconductor substrate 1 (the second semiconductor region 5). A part of the generated charges moves, as the signal charges, in a direction of the first transfer electrode TX1 or the second transfer electrode TX2 in accordance with a potential gradient formed by voltage applied to the photo-gate electrode PG and the first and second transfer electrodes TX1 and TX2. That is, a part of the generated charges moves, as the signal charges, in a direction parallel to the first and second short side-edges S1 and S2 of the photo-gate electrode PG.

When a positive potential is supplied to the first transfer electrode TX1, a potential below the first transfer electrode TX1 becomes lower than a potential in the region below the photo-gate electrode PG in the semiconductor substrate 1 (the second semiconductor region 5) with respect to a negative charge (electrons). Thus, the electrons are drawn in the direction of the first transfer electrode TX1, and accumulated in a potential well formed by the first signal charge-accumulating region FD1. When a positive potential is supplied to the second transfer electrode TX2, a potential below the second transfer electrode TX2 becomes lower than a potential in the region below the photo-gate electrode PG in the semiconductor substrate 1 (the second semiconductor region 5) with respect to a negative charge (electron). Thus, the electron is drawn in the direction of the second transfer electrode TX2, and accumulated in a potential well formed by the second signal charge-accumulating region FD2. An n-type semiconductor contains a positively ionized donor, has a positive potential, and attracts electrons. When a potential (for example, a ground potential) lower than the above positive potential is supplied to the first or second transfer electrode TX1 or TX2, a potential barrier is generated by the first or second transfer electrode TX1 or TX2. Thus, the charges generated in the semiconductor substrate 1 are neither drawn to the first signal charge-accumulating region FD1 nor the second signal charge-accumulating region FD2.

Figure 6:
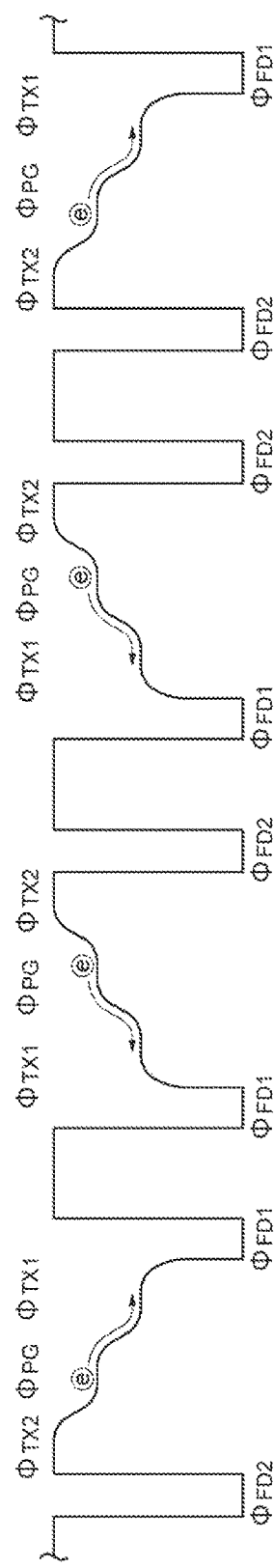
FIG. 6 is a diagram illustrating potential profile in the vicinity of a second surface of a semiconductor substrate.
Figure 7:
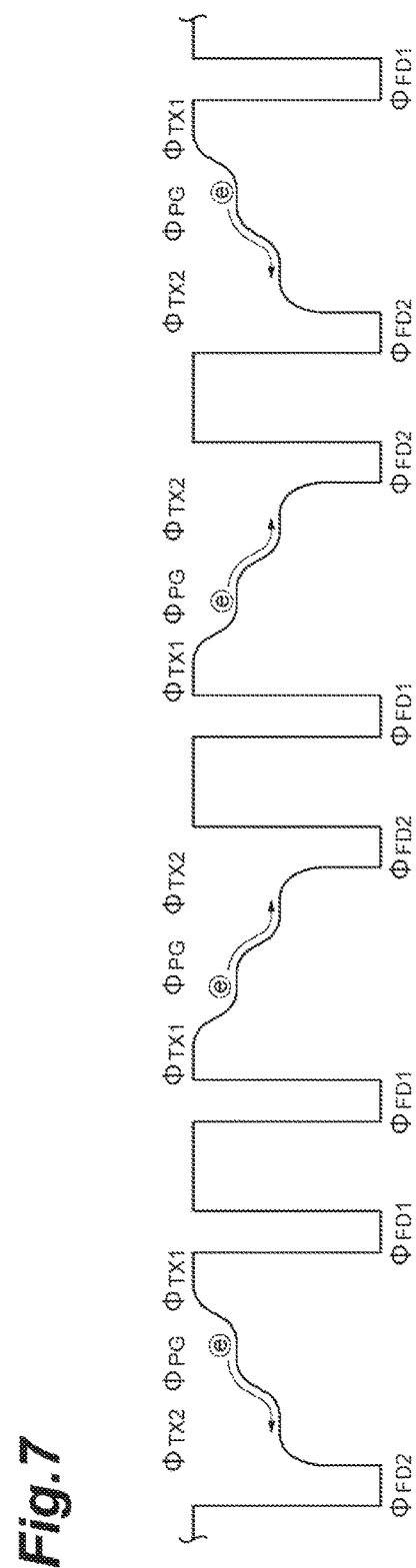
FIG. 7 is a diagram illustrating potential profile in the vicinity of a second surface of a semiconductor substrate.

FIGS. 6 and 7 are diagrams illustrating potential profiles in the vicinity of the second surface of the semiconductor substrate taken along the line V-V of FIG. 4. In FIGS. 6 and 7, the downward direction is the positive direction of a potential.

When light is incident, a potential $\varphi_{PG}$ in the region immediately below the photo-gate electrode PG is set slightly higher than a substrate potential due to a potential supplied to the photo-gate electrode PG (for example, an intermediate potential between a higher electric potential and a lower electric potential supplied to the first transfer electrode TX1). In FIGS. 6 and 7, a potential $\varphi_{TX1}$ in the region immediately below the first transfer electrode TX1, a potential $\varphi_{TX2}$ in the region immediately below the second transfer electrode TX2, a potential $\varphi_{PG}$ in the charge-generating region immediately below the photo-gate electrode PG; a potential $\varphi_{FD1}$ in the first signal charge-accumulating region FD1, and a potential $\varphi_{FD2}$ in the second signal charge-accumulating region FD2 are illustrated.

With reference to FIGS. 6 and 7, an accumulation operation of the signal charges will be described. When the phase of the first transfer signal $S_{p1}$ applied to the first transfer electrode TX1 is 0°, a positive potential is supplied to the first transfer electrode TX1. An inverse potential, that is, a potential (for example, a ground potential) whose phase is shifted by 180° is supplied to the second transfer electrode TX2. An intermediate potential between the potential supplied to the first transfer electrode TX1 and the potential supplied to the second transfer electrode TX2 is supplied to the photo-gate electrode PG. In this case, the potential $\varphi_{TX1}$ in the semiconductor region immediately below the first transfer electrode TX1 becomes lower than the potential $\varphi_{PG}$ in the charge-generating region as illustrated in FIG. 6, and thus negative charge e generated in the charge-generating region flows into the potential well of the first signal charge-accumulating region FD1.

The potential $\varphi_{TX2}$ in the semiconductor region immediately below the second transfer electrode TX2 does not become lower, and the charge does not flow into the potential well of the second signal charge-accumulating region FD2. Therefore, the signal charges are collected and accumulated in the potential well of the first signal charge-accumulating region FD1. Since the first and second signal charge-accumulating regions FD1 and FD2 are doped with n-type impurities, and the potentials are recessed in the positive direction.

When the phase of the second transfer signal $S_{p2}$ applied to the second transfer electrode TX2 is 0°, a positive potential is supplied to the second transfer electrode TX2. An inverse potential, that is, a potential whose phase is shifted by 180° (for example, a ground potential) is supplied to the first transfer electrode TX1. An intermediate potential between the potential supplied to the first transfer electrode TX1 and the potential supplied to the second transfer electrode TX2 is supplied to the photo-gate electrode PG. In this case, the potential $\varphi_{TX2}$ in the semiconductor region immediately below the second transfer electrode TX2 becomes lower than the potential $\varphi_{PG}$ in the charge-generating region as illustrated in FIG. 7, and thus negative charge e generated in the charge-generating region flows into the potential well of the second signal charge-accumulating region FD2.

The potential $\varphi_{TX1}$ in the semiconductor region immediately below the first transfer electrode TX1 does not become lower, and the charge does not flow into the potential well of the first signal charge-accumulating region FD1. Therefore, the signal charges are collected and accumulated in the potential well of the second signal charge-accumulating region FD2.

In such manners, the signal charges are collected and accumulated in the potential wells of the first and second signal charge-accumulating regions FD1 and FD2. The signal charges accumulated in the potential wells of the first and second signal charge-accumulating regions FD1 and FD2 are read out to the outside thereof.

Figure 8:
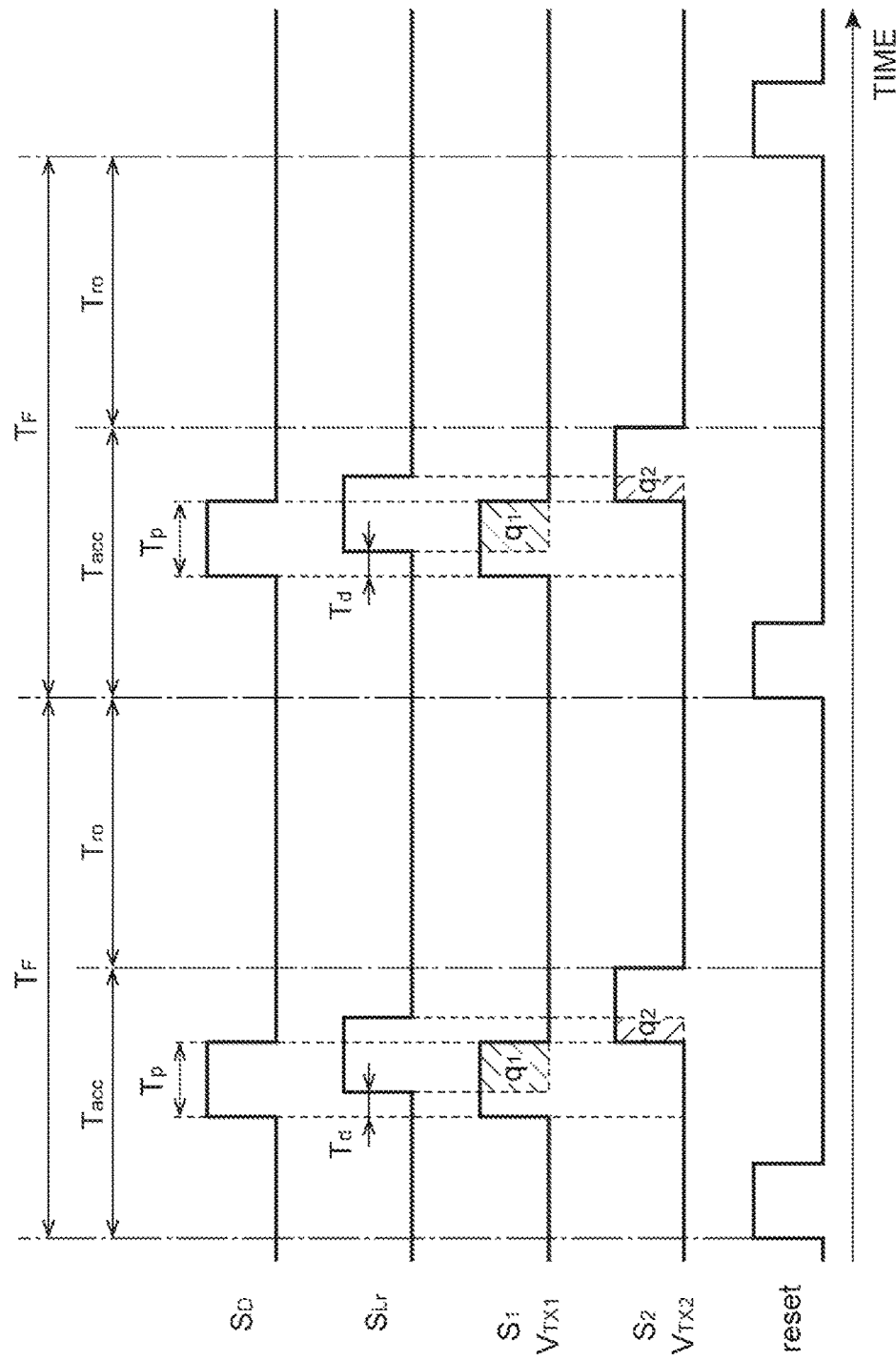
FIG. 8 is a timing chart of various signals.

Successively, the method for arithmetization the distance d will be described with reference to FIG. 8. FIG. 8 is a timing chart of various signals. FIG. 8 illustrates various signals in two frame periods $T_F$, which are continuous in time series, among a plurality of frame periods $T_F$.

In FIG. 8, a drive signal $S_D$ of the light source LS, an intensity signal $S_{Lr}$ of the reflection light Lr, a first transfer signal $S_{p1}$ applied to the first transfer electrode TX1, a second transfer signal $S_{p2}$ applied to the second transfer electrode TX2, and a reset signal reset are illustrated. The intensity signal $S_{Lr}$ of the reflection light Lr is an intensity signal obtained by causing the reflection light Lr of the pulse light Lp at the object OJ to be incident onto the range image sensor RS (the charge-generating region). The two frame periods $T_F$ each include a period in which the signal charges are accumulated (an accumulation period) $T_{acc}$ and a period in which the signal charges are read out (a readout period)

$T_{ro}$. All of the drive signal $S_D$, the intensity signal $S_{Lr}$, the first transfer signal $S_{p1}$, and the second transfer signal $S_{p2}$ are pulse signals having the pulse width $T_p$.

During the accumulation period $T_{acc}$, before ranging, the reset signal reset is applied to the first and second signal charge-accumulating regions FD1 and FD2. Accordingly, the charges accumulated in the first and second signal charge-accumulating regions FD1 and FD2 are discharged to the outside thereof. In this example, the reset signal reset turns momentarily ON and then turned OFF, the drive signal $S_D$ is applied to the light source LS thereafter. In synchronization with the application of the drive signal $S_D$, the first and second transfer signals $S_{p1}$ and $S_{p2}$ are applied to the first and second transfer electrodes TX1 and TX2 in an inverse phase to each other. Accordingly, the charges are transferred, and the signal charges are accumulated in the first and second signal charge-accumulating regions FD1 and FD2. Then, during the readout period $T_{ro}$, the signal charges accumulated in the first and second signal charge-accumulating regions FD1 and FD2 are read out.

During each of the frame periods $T_F$, the first transfer signal $S_{p1}$ is output in synchronization with the drive signal $S_D$ at the phase difference 0, and the second transfer signal $S_{p2}$ is output in synchronization with the drive signal $S_D$ at the phase difference 180°. The output of the first and second transfer signals $S_{p1}$ and $S_{p2}$ is controlled by the controlling unit CONT. That is, per each frame period $T_F$, the controlling unit CONT outputs the first transfer signal $S_{p1}$ to the first transfer electrode TX1 so that the charges generated in the charge-generating region flow into the first signal charge-accumulating region FD1 as the signal charges and outputs the second transfer signal $S_{p2}$ different in phase from the first transfer signal $S_{p1}$ to the second transfer electrode TX2 so that the charges generated in the charge-generating region flow into the second signal charge-accumulating region FD2 as the signal charges, to synchronize with the emission of the pulse light Lp.

The charge quantity $q_1$ corresponds to an overlap between the intensity signal $S_{Lr}$ and the first transfer signal $S_{p1}$ output in synchronization with the drive signal $S_D$ at the phase difference 0 is accumulated in the first signal charge-accumulating region FD1. The charge quantity $q_2$ corresponds to an overlap between the intensity signal $S_{Lr}$ of the reflection light Lr and the second transfer signal $S_{p2}$ output in synchronization with the drive signal $S_D$ at the phase difference 180° is accumulated in the second signal charge-accumulating region FD2.

The phase difference Td between the intensity signal $S_{Lr}$ and the signal output in synchronization with the drive signal $S_D$ at the phase difference 0 is equal to the flight time of the light, and indicates the distance d from the range image sensor RS to the object OJ. The distance d is calculated by the arithmetic unit ART using a ratio of the charge quantity $q_1$ and the charge quantity $q_2$ in one frame period $T_F$ with the following expression (1). c is the speed of light.

$$\text{Distance } d = (c/2) \times (T_p \times q_2/(q_1+q_2)) \qquad (1)$$

That is, the arithmetic unit ART reads out the charge quantity $q_1$ and $q_2$ of the signal charges accumulated in the first and second signal charge-accumulating regions FD1 and FD2 per each frame period $T_F$, and calculates the distance d to the object OJ based on the readout charge quantities $q_1$ and $q_2$.

In a charge-distributing type range image sensor including a plurality of range sensors disposed in a one-dimensional direction, when charge crosstalk (leakage) occurs between adjacent range sensors in the one-dimensional direction, the influence of the charge crosstalk on ranging can be different between the adjacent range sensors. If the influence of the charge crosstalk on the ranging is different between the adjacent range sensors, it is difficult to appropriately perform the ranging.

The charge crosstalk (leakage) occurring between the range sensors adjacent to each other in the one-dimensional direction will be described.

In a case where the configurations of all range sensors included in the range image sensor are the same, each of the range sensors includes, for example, the first signal charge-accumulating region and the first transfer electrode closer to one side of the one-dimensional direction than the photo-gate electrode, and includes the second signal charge-accumulating region and the second transfer electrode closer to an another side of the one-dimensional direction than the photo-gate electrode. Thus, in the adjacent two range sensors, the first signal charge-accumulating region and the second signal charge-accumulating region are adjacent to each other in the one-dimensional direction.

In the above described range image sensor, when reflection light is incident into, for example, the range sensor positioned in the center of the three range sensors, charges are generated in the range sensor (hereinafter, referred to as an incident range sensor) in accordance with the reflection light. The generated charges are distributed to the first and second signal charge-accumulating regions of the incident range sensor in accordance with the first and second transfer signals. At this time, a part of the charges leaks into the first and second signal charge-accumulating regions of the two range sensors other than the incident range sensor. The leakage quantity largely varies depending on whether the first and second signal charge-accumulating regions are disposed at the incident range sensor side.

In a range sensor positioned next to the incident range sensor in one direction of the one-dimensional direction (hereinafter, referred to as a one-side range sensor), the first signal charge-accumulating region is disposed closer to the incident range sensor side than the charge-generating region, and the second signal charge-accumulating region is disposed closer to the opposite side to the incident range sensor than the charge-generating region. In a range sensor positioned next to the incident range sensor in the other direction of the one-dimensional direction (hereinafter, referred to as an other-side range sensor), the second signal charge-accumulating region is disposed closer to the incident range sensor side than the charge-generating region, and the first signal charge-accumulating region is disposed closer to the opposite side to the incident range sensor than the charge-generating region.

When the charges leak from the incident range sensor into the one-side range sensor, the leakage quantity to the first signal charge-accumulating region is larger than the leakage quantity to the second signal charge-accumulating region in the one-side range sensor. When the charges leak from the incident range sensor into the other-side range sensor, the leakage quantity to the second signal charge-accumulating region is larger than the leakage quantity to the first signal charge-accumulating region in the other-side range sensor. Thus, when the charge crosstalk occurs between the range sensors adjacent to each other in the one-dimensional direction, the charge quantities accumulated in the first and second signal charge-accumulating regions may be different between the one-side range sensor and the other-side range sensor.

In the present embodiment, attention is focused on an arbitrary range sensor among the range sensors $P_{A1}$ to $P_{AM}$ and $P_{B1}$ to $P_{BN}$. In a range sensor positioned next to the arbitrary range sensor in the one direction A1, in a case where the first signal charge-accumulating region FD1 is positioned closer to the other direction A2 side than the charge-generating region, the first signal charge-accumulating region FD1 is positioned closer to the one direction A1 side than the charge-generating region in a range sensor positioned next to the arbitrary range sensor in the other direction A2. In the range sensor positioned next to the arbitrary range sensor in the one direction A1, in a case where the second signal charge-accumulating region FD2 is positioned closer to the other direction A2 side than the charge-generating region, the second signal charge-accumulating region FD2 is positioned closer to the one direction A1 side than the charge-generating region in the range sensor positioned next to the arbitrary range sensor in the other direction A2. That is, in the range sensor positioned next to the arbitrary range sensor in the one direction A1 and the range sensor positioned next to the arbitrary range sensor in the other direction A2, the signal charge-accumulating regions positioned at the arbitrary range sensor side are the first signal charge-accumulating regions FD1 or the second signal charge-accumulating regions FD2, and the same types of signal charge-accumulating regions.

Thus, when a part of the charges generated in the charge-generating region in the arbitrary range sensor leaks into the range sensor positioned next to the arbitrary range sensor in the one direction A1 and the range sensor positioned next to the arbitrary range sensor in the other direction A2, the leaking charges flow into the first signal charge-accumulating regions FD1 or the second signal charge-accumulating regions FD2 of two range sensors. The charges leaking into the above two range sensors are accumulated in the first signal charge-accumulating regions FD1 or the second signal charge-accumulating regions FD2 of the two range sensors. Accordingly, when the charge crosstalk occurs between the range sensors adjacent to each other in the one-dimensional direction A, the types of the signal charge-accumulating regions, in which the leaking charges are accumulated, are the same in the two range sensors positioned at both sides among any three of three range sensors consecutively aligned in the one-dimensional direction A. For this reason, and the influence of the charge crosstalk on ranging between the range sensors adjacent to each other in the one-dimensional direction A is similar.

The embodiment of the present invention has been described above; the present invention is not necessarily limited to the above described embodiment, and can be variously changed without departing from the gist.

The range sensors $P_{A1}$ to $P_{AM}$ and $P_{B1}$ to $P_{BN}$ each include one first transfer electrode TX1, one second transfer electrode TX2, one first signal charge-accumulating region FD1, and one second signal charge-accumulating region FD2, but are not limited thereto. The range sensors $P_{A1}$ to $P_{AM}$ and $P_{B1}$ to $P_{BN}$ each may include two or more first transfer electrodes TX1, two or more second transfer electrodes TX2, two or more first signal charge-accumulating regions FD1, and two or more second signal charge-accumulating regions FD2.

The range sensors $P_{A1}$ to $P_{AM}$ and $P_{B1}$ to $P_{BN}$ each may further include an unnecessary charge-discharging region and a third transfer electrode. The unnecessary charge-discharging region discharges the charges generated in the charge-generating region to the outside thereof as unnecessary charges. The third transfer electrode is disposed between the unnecessary charge-discharging region and the charge-generating region, and allows the charges generated in the charge-generating region into the unnecessary charge-discharging region as the unnecessary charges in accordance with a third transfer signal different in phase from the first and second transfer signals. In a case where each of the range sensors $P_{A1}$ to $P_{AM}$ and $P_{B1}$ to $P_{BN}$ includes the unnecessary charge-discharging region and the third transfer electrode, the unnecessary charges can be discharged to the outside thereof, and it is possible to improve ranging accuracy. The unnecessary charge-discharging region and the third transfer electrode each may be two or more.

In each of the frame periods $T_F$, the drive signals $S_D$ are successively applied, and in synchronization with which, the first transfer signal $S_{p1}$ and the second transfer signal $S_{p2}$ may be successively output. In this case, the signal charges are integrated and accumulated in the first and second signal charge-accumulating regions FD1 and FD2.

Although the range image sensor RS is the line sensor that includes the plurality of range sensors $P_{A1}$ to $P_{AM}$ and $P_{B1}$ to $P_{BN}$ disposed one-dimensionally, the range sensors $P_{A1}$ to $P_{AM}$ and $P_{B1}$ to $P_{BN}$ may be disposed two-dimensionally. In this case, a two-dimensional image can be easily obtained. A two-dimensional image can be obtained by rotating the line sensor or by scanning with two line sensors.

The range image sensor RS is not limited to the front-illuminated range image sensor. The range image sensor RS may be a back-illuminated range image sensor.

The charge-generating region that generates the charges in accordance with incident light may include a photodiode (for example, an embedded photodiode).

The p-type and n-type of conductive types in the range image sensor RS according to the present embodiment may be replaced by each other to be inversed to those in the above description.

INDUSTRIAL APPLICABILITY

The present invention can be applicable to a charge-distributing type range image sensor.

REFERENCE SIGNS LIST

1: semiconductor substrate, 10: ranging device, A: one-dimensional direction, FD1: first signal charge-accumulating region, FD2: second signal charge-accumulating region, $P_{A1}$ to $P_{AM}$, $P_{B1}$ to $P_{BN}$: range sensor, PG: photo-gate electrode, RS: range image sensor, $S_{p1}$: first transfer signal, $S_{p2}$: second transfer signal, TX1: first transfer electrode, TX2: second transfer electrode.

The invention claimed is:

1. A range image sensor comprising a plurality of range sensors disposed in a one-dimensional direction, wherein each of the plurality of range sensors comprises:
   a charge-generating region generating charges in accordance with incident light;
   a first and a second signal charge-accumulating regions disposed away from the charge-generating region to sandwich the charge-generating region in the one-dimensional direction, and accumulating the charges generated in the charge-generating region as signal charges;
   a first transfer electrode disposed between the first signal charge-accumulating region and the charge-generating region and configured to allow the charges generated in the charge-generating region to flow into the first signal charge-accumulating region as the signal charges in accordance with a first transfer signal; and
   a second transfer electrode disposed between the second signal charge-accumulating region and the charge-generating region and configured to allow the charges generated in the charge-generating region to flow into the second signal charge-accumulating region as the signal charges in accordance with a second transfer signal different in phase from the first transfer signal, and in any three of the range sensors consecutively aligned in the one-dimensional direction, the first signal charge-accumulating regions or the second signal charge-accumulating regions are adjacent to each other in the one-dimensional direction in a range sensor positioned in a center of the three range sensors and a range sensor positioned closer to one side of the one-dimensional direction than the range sensor positioned in the center of the three range sensors, and the first signal charge-accumulating region and the second signal charge-accumulating region are adjacent to each other in the one-dimensional direction in the range sensor positioned in the center of the three range sensors and a range sensor positioned closer to an another side of the one-dimensional direction than the range sensor positioned in the center of the three range sensors.

2. A range image sensor comprising a plurality of range sensors disposed in a one-dimensional direction, wherein each of the plurality of range sensors comprises:

a charge-generating region generating charges in accordance with incident light;

a first and a second signal charge-accumulating regions disposed away from the charge-generating region to sandwich the charge-generating region in the one-dimensional direction, and accumulating the charges generated in the charge-generating region as signal charges;

a first transfer electrode disposed between the first signal charge-accumulating region and the charge-generating region and configured to allow the charges generated in the charge-generating region to flow into the first signal charge-accumulating region as the signal charges in accordance with a first transfer signal; and a second transfer electrode disposed between the second signal charge-accumulating region and the charge-generating region and configured to allow the charges generated in the charge-generating region to flow into the second signal charge-accumulating region as the signal charges in accordance with a second transfer signal different in phase from the first transfer signal, and a range sensor group including the two range sensors in which the first signal charge-accumulating regions are adjacent to each other in the one-dimensional direction and a range sensor group including the two range sensors in which the second signal charge-accumulating regions are adjacent to each other in the one-dimensional direction are alternately aligned in the one-dimensional direction.

* * * * *